United States Patent
Rao et al.

(10) Patent No.: US 8,797,792 B2
(45) Date of Patent: Aug. 5, 2014

(54) NON-REVERSIBLE STATE AT A BITCELL HAVING A FIRST MAGNETIC TUNNEL JUNCTION AND A SECOND MAGNETIC TUNNEL JUNCTION

(71) Applicant: QUALCOMM Incorporated, San Diego, CA (US)

(72) Inventors: Hari M. Rao, San Diego, CA (US); Jung Pil Kim, San Diego, CA (US); Seung H. Kang, San Diego, CA (US); Xiaochun Zhu, San Diego, CA (US); Tae Hyun Kim, San Diego, CA (US); Kangho Lee, San Diego, CA (US); Xia Li, San Diego, CA (US); Wah Nam Hsu, San Diego, CA (US); Wuyang Hao, San Jose, CA (US); Jungwon Suh, San Diego, CA (US); Nicholas K. Yu, San Diego, CA (US); Matthew Michael Nowak, San Diego, CA (US); Steven M. Millendorf, San Diego, CA (US); Asaf Ashkenazi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/022,364

(22) Filed: Sep. 10, 2013

(65) Prior Publication Data
US 2014/0010006 A1    Jan. 9, 2014

Related U.S. Application Data

(62) Division of application No. 12/849,043, filed on Aug. 3, 2010, now Pat. No. 8,547,736.

(51) Int. Cl.
| | | |
|---|---|---|
| *G11C 11/00* | (2006.01) | |
| *G11C 11/16* | (2006.01) | |
| *G11C 11/14* | (2006.01) | |
| *G11C 17/02* | (2006.01) | |
| *G11C 17/16* | (2006.01) | |
| *G11C 29/02* | (2006.01) | |

(52) U.S. Cl.
CPC ............ *G11C 11/16* (2013.01); *G11C 11/14* (2013.01); *G11C 17/02* (2013.01); *G11C 17/16* (2013.01); *G11C 29/027* (2013.01)
USPC ................... 365/158; 365/171; 365/173

(58) Field of Classification Search
CPC ........ G11C 11/16; G11C 11/14; G11C 17/02; G11C 17/16; G11C 29/027
USPC .......................... 365/158, 171, 173
See application file for complete search history.

(56) References Cited

U.S. PATENT DOCUMENTS

| | | | |
|---|---|---|---|
| 5,646,904 A | | 7/1997 | Ohno et al. |
| 6,272,041 B1 * | | 8/2001 | Naji ............................ 365/171 |

(Continued)

FOREIGN PATENT DOCUMENTS

| | | |
|---|---|---|
| JP | 2002117684 A | 4/2002 |
| JP | 2002260377 A | 9/2002 |

(Continued)

OTHER PUBLICATIONS

International Preliminary Report on Patentability—PCT/US2011/046429, The International Bureau of WIPO—Geneva, Switzerland, Nov. 28, 2012.

(Continued)

*Primary Examiner* — Pho M Luu
(74) *Attorney, Agent, or Firm* — Sam Talpalatsky; Nicholas J. Pauley; Joseph Agusta

(57) ABSTRACT

A memory device includes a magnetic tunnel junction (MTJ) bitcell. The MTJ bitcell includes a first MTJ and a second MTJ. The memory device further includes programming circuitry configured to generate a non-reversible state at the bitcell by applying a program signal to a selected one of the first MTJ and the second MTJ of the bitcell. The non-reversible state corresponds to a value of the MTJ bitcell that is determined by comparing a first value read at the first MTJ and a second value read at the second MTJ.

20 Claims, 7 Drawing Sheets

(56) References Cited

U.S. PATENT DOCUMENTS

| | | | |
|---|---|---|---|
| 6,490,217 B1 * | 12/2002 | DeBrosse et al. | 365/225.5 |
| 6,693,822 B2 | 2/2004 | Ito | |
| 6,751,149 B2 | 6/2004 | Seyyedy et al. | |
| 7,164,598 B2 * | 1/2007 | Jeong et al. | 365/158 |
| 7,209,382 B2 | 4/2007 | Iwata et al. | |
| 7,224,630 B2 | 5/2007 | Andre et al. | |
| 7,486,537 B2 | 2/2009 | Scheuerlein et al. | |
| 7,499,313 B2 | 3/2009 | Katti | |
| 7,511,981 B2 * | 3/2009 | Asano et al. | 365/66 |
| 7,532,533 B2 | 5/2009 | Andre et al. | |
| 7,577,021 B2 | 8/2009 | Guo et al. | |
| 7,859,891 B2 | 12/2010 | Li et al. | |
| 7,894,248 B2 * | 2/2011 | Yu et al. | 365/158 |
| 7,995,378 B2 * | 8/2011 | Yoon et al. | 365/158 |
| 8,213,211 B2 | 7/2012 | Kurjanowicz | |
| 8,547,736 B2 * | 10/2013 | Rao et al. | 365/158 |
| 2002/0054500 A1 | 5/2002 | Yamada | |
| 2003/0090935 A1 | 5/2003 | Hidaka | |
| 2005/0045931 A1 | 3/2005 | Min et al. | |
| 2008/0205124 A1 | 8/2008 | Inaba | |
| 2009/0046501 A1 | 2/2009 | Ranjan et al. | |
| 2009/0261437 A1 | 10/2009 | Kang et al. | |
| 2010/0067293 A1 | 3/2010 | Yu et al. | |

FOREIGN PATENT DOCUMENTS

| | | |
|---|---|---|
| JP | 2003217277 A | 7/2003 |
| JP | 2005018916 A | 1/2005 |
| JP | 2010225259 A | 10/2010 |

OTHER PUBLICATIONS

International Search Report and Written Opinion—PCT/US2011/046429—ISA/EPO—Mar. 20, 2012.

* cited by examiner

US 8,797,792 B2

NON-REVERSIBLE STATE AT A BITCELL HAVING A FIRST MAGNETIC TUNNEL JUNCTION AND A SECOND MAGNETIC TUNNEL JUNCTION

I. CLAIM OF PRIORITY

The present application claims priority from and is a divisional of U.S. Pat. No. 8,547,736, filed Aug. 3, 2010, entitled "GENERATING A NON-REVERSIBLE STATE AT A BITCELL HAVING A FIRST MAGNETIC TUNNEL JUNCTION AND A SECOND MAGNETIC TUNNEL JUNCTION," the content of which is incorporated by reference herein in its entirety.

II. FIELD

The present disclosure is generally related to a magnetic tunnel junction based one-time programmable bitcell.

III. DESCRIPTION OF RELATED ART

Advances in technology have resulted in smaller and more powerful computing devices. Such portable computing devices may include security architectures based on one-time programmable elements, such as a nonvolatile memory device having one-time programmable (OTP) memory cells. An OTP memory cell maintains a permanent state once the cell is programmed. For example, polysilicon fuses have been used as OTP elements. A polysilicon fuse memory cell can be programmed by applying a voltage across the cell so that the cell is "blown" during programming. For example, one-time programming is typically performed by blowing the silicon with a high current (e.g., on order of milliamperes) for a relatively long time (e.g., microseconds). One drawback of polysilicon fuses is that the integrity of the fuse is difficult to test before blowing the fuse. Another drawback of polysilicon fuses is that a blown state is visibly detectable, which may compromise security.

IV. SUMMARY

A one-time programmable element based on magnetic tunnel junction (MTJ) technology is described. The one-time programmable element is configured as a bitcell having a first resistive memory element and a second resistive memory element. The first and second resistive memory elements may each be MTJs. The native un-blown state of a MTJ has a higher resistance and the blown state of an MTJ has a lower resistance. A program signal can be applied to one of the first MTJ and the second MTJ without applying the program signal to the other one of the first MTJ and the second MTJ to generate a non-reversible state at the bitcell. For example, the non-reversible state may be generated by breaking down a tunnel oxide of one of the MTJs. When the tunnel oxide is broken down, a permanent low resistance state is created.

In a particular embodiment, a method of generating a non-reversible state at a bitcell having a first magnetic tunnel junction (MTJ) and a second MTJ includes applying a program voltage to the first MTJ of the bitcell without applying the program voltage to the second MTJ of the bitcell.

In another particular embodiment, a memory device includes a magnetic tunnel junction (MTJ) bitcell. The MTJ bitcell includes a first MTJ, a second MTJ, and programming circuitry configured to generate a non-reversible state at the bitcell by applying a program signal to a selected one of the first MTJ and the second MTJ of the bitcell.

One particular advantage provided by at least one of the disclosed embodiments is that high speed programming may be achieved by a non-reversible state being programmed to a bitcell having a first magnetic tunnel junction (MTJ) and a second MTJ.

Another particular advantage provided by at least one of the disclosed embodiments is that prior to programming, operation of the bitcell may be tested.

Another particular advantage provided by at least one of the disclosed embodiments is enhanced security in that visible detection of a programmed state of the bitcell is more difficult than for polysilicon fuses.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

Figure 6:
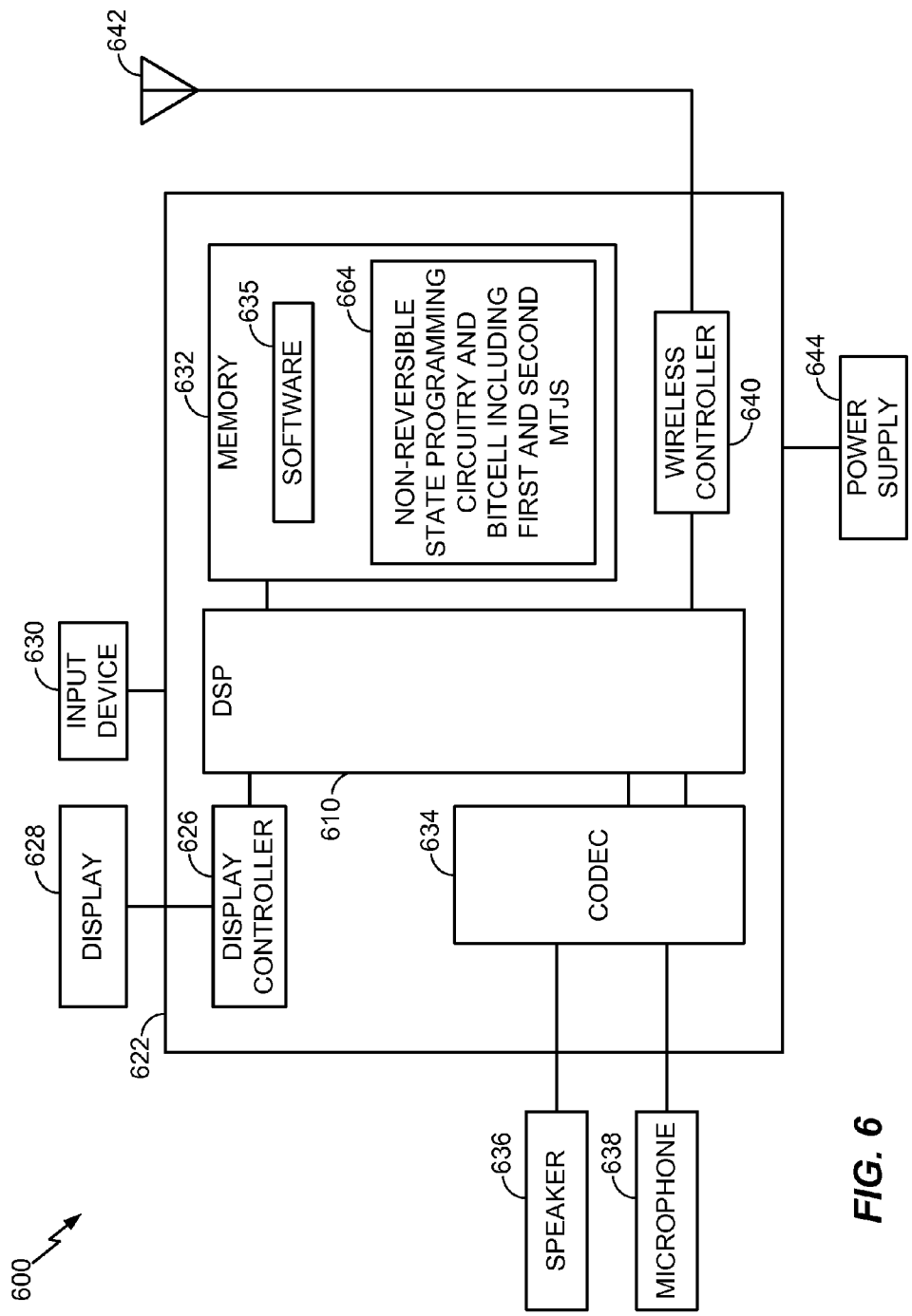
Figure 7:
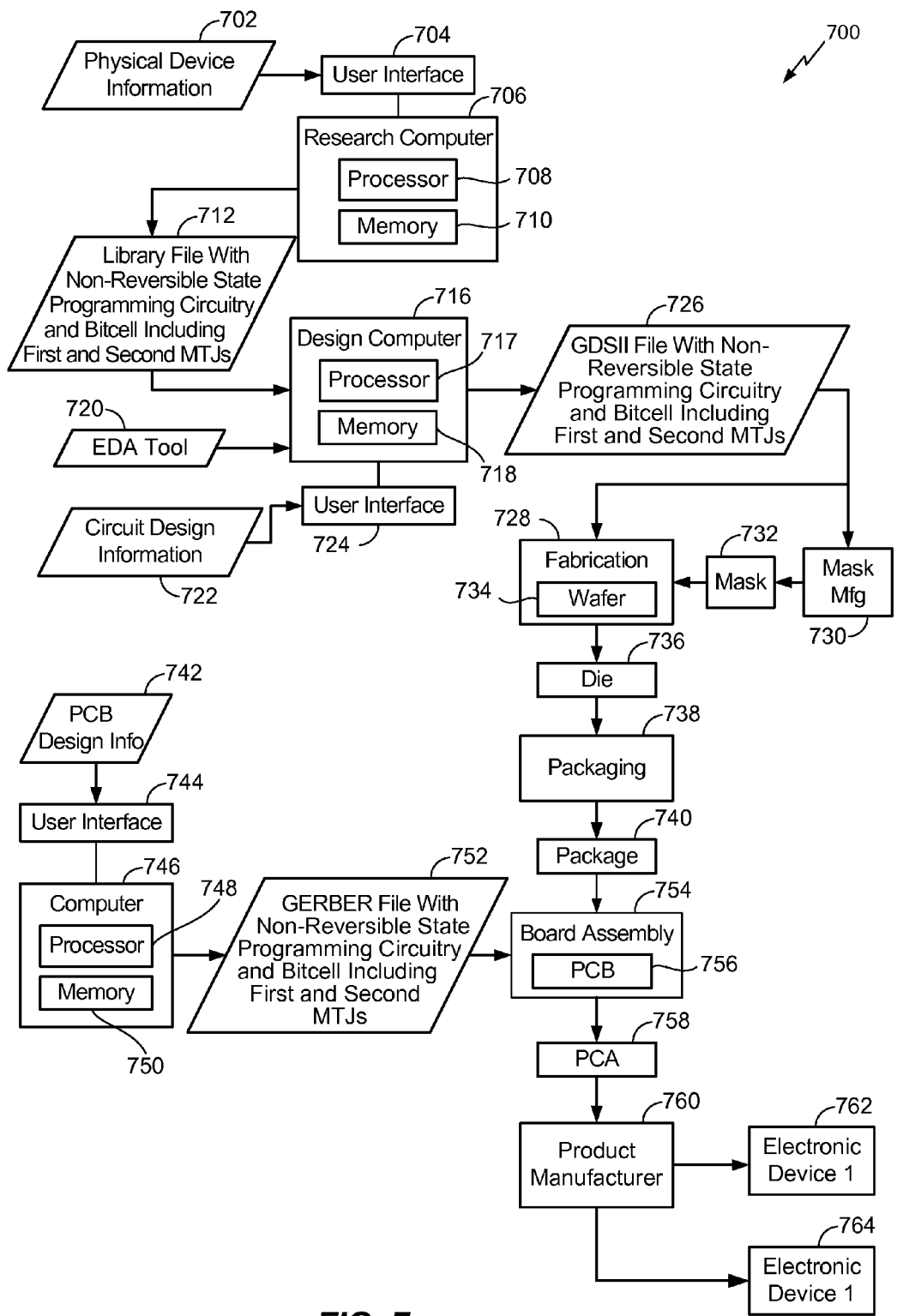

FIG. 6 is a block diagram of a particular illustrative embodiment of a device including non-reversible state programming circuitry configured to provide a programming voltage to one of a first MTJ and a second MTJ of a bitcell; and FIG. 7 is a diagram of a particular illustrative embodiment of a manufacturing process that may be used to produce a wireless device including non-reversible state programming circuitry configured to program a non-reversible state to a bitcell having a first MTJ and a second MTJ.

VI. DETAILED DESCRIPTION

Figure 1:
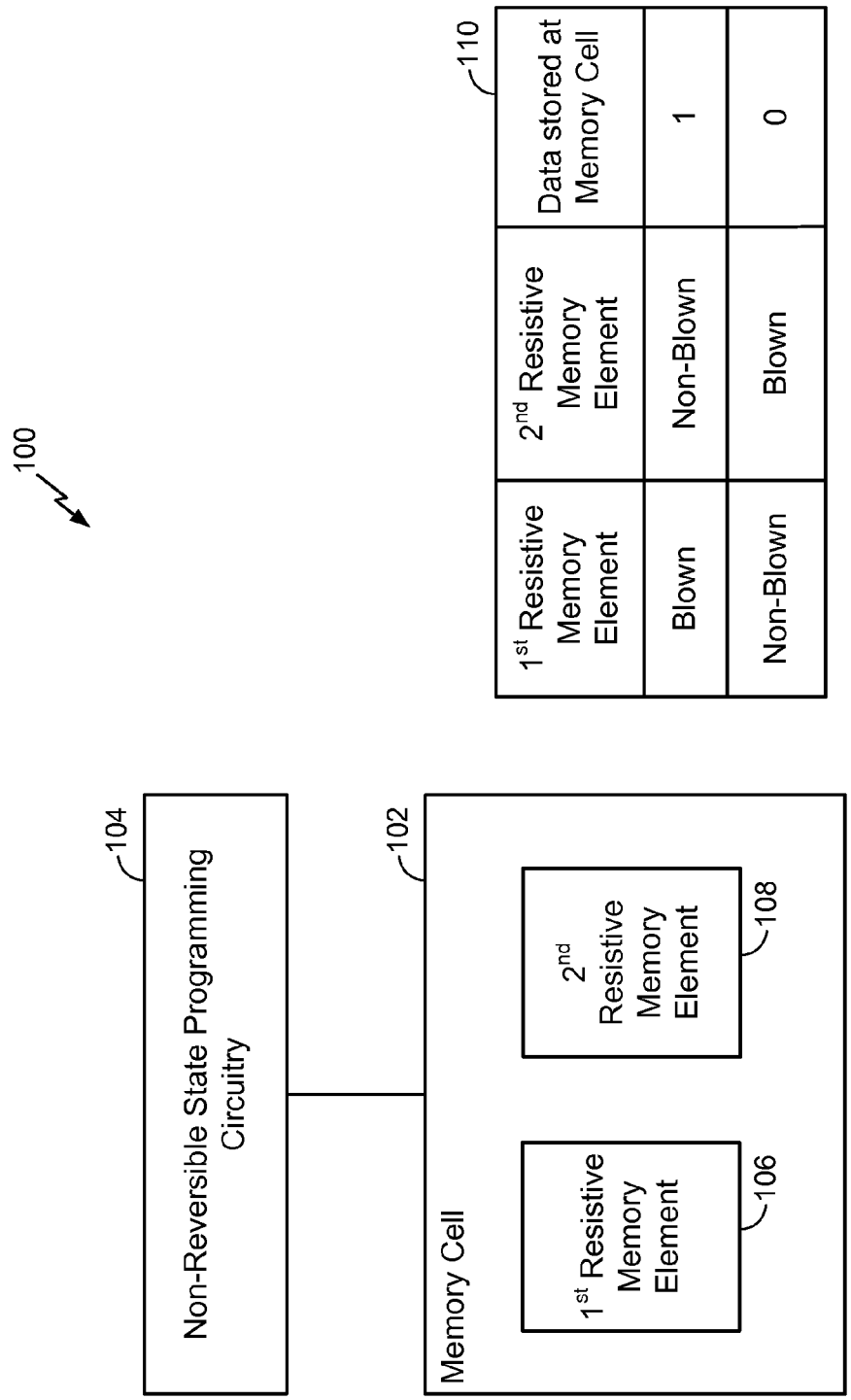
FIG. 1 is a block diagram of a particular illustrative embodiment of a memory device including non-reversible state programming circuitry and a memory cell including a first resistive memory element and a second resistive memory element.

Referring to FIG. 1, a particular illustrative embodiment of a memory device including non-reversible state programming circuitry and a memory cell to store data as non-reversible states in dual-element cells is depicted and generally designated 100. The memory device 100 includes a representative memory cell 102 and non-reversible state programming circuitry 104. The memory cell 102 includes a first resistive memory element 106 and a second resistive memory element 108. In a particular embodiment, the first resistive memory element 106 is a first magnetic tunnel junction (MTJ) element and the second resistive memory element 108 is a second MTJ element. The non-reversible state programming circuitry 104 is configured to apply a program signal to one of the first resistive memory element 106 and the second resistive memory element 108 of the memory cell 102 to program a non-reversible state to the memory cell 102.

In a particular embodiment, one-time programmability is achieved by non-reversibly programming one of the two resistive memory elements 106, 108 in the memory cell 102. For example, a program voltage may be applied to the first resistive memory element 106 of the memory cell 102 via the non-reversible state programming circuitry 104 without applying the program voltage to the second resistive memory element 108 of the memory cell 102 to generate a non-reversible state at the memory cell 102. Alternatively, a program voltage may be applied to the second resistive memory element 108 of the memory cell 102 via the non-reversible state programming circuitry 104 without applying the program voltage to the first resistive memory element 106 of the memory cell 102 to generate a non-reversible state at the memory cell 102. To illustrate, when the first resistive memory element 106 is an MTJ, the program voltage may cause a tunnel oxide of the first resistive memory element 106 to break down resulting in a permanent low resistance state of the first resistive memory element 106. Similarly, when the second resistive memory element 108 is an MTJ, the program voltage may cause a tunnel oxide of the second resistive memory element 108 to break down resulting in a permanent low resistance state of the second resistive memory element 108. In a particular embodiment, the tunnel oxide may be a magnesium oxide barrier layer within an MTJ and the program voltage may be greater than approximately 1.3 volts.

When the tunnel oxide of one of the resistive memory elements is broken down, a permanent low-resistance state is created. For example, once blown (e.g., once the tunnel oxide is broken down), a resistance of the blown resistive memory element may be approximately 250 ohms. A native un-blown state of a resistive memory element may be a higher resistance, for example 2500 ohms. For example, as illustrated in table 110, if the first resistive memory element 106 is blown and the second resistive memory element 108 is non-blown, the data stored at the memory cell 102 may represent a logic "1" state. Alternatively, if the first resistive memory element 106 is non-blown and the second resistive memory element 108 is blown, the data stored at the memory cell 102 may represent a logic "0" state.

In a particular embodiment, prior to programming a non-reversible state to the memory cell 102, the memory cell 102 may be used as a many-time programmable (MTP) cell by applying a write voltage (as opposed to a program voltage) to the first resistive memory element 106 or to the second resistive memory element 108 to store a reversible value to the memory cell 102. Examples of MTP cells are further described with respect to FIG. 4. Use of the memory cell 102 as a one-time programmable (OTP) cell or a MTP cell enables testing of an operation of the memory cell 102 by reading a respective one of the first resistive memory element 106 and the second resistive memory element 108 after applying the write voltage to the first resistive memory element 106 or to the second resistive memory element 108.

In a particular embodiment, when the memory cell 102 is configured as an OTP memory cell, the non-reversible state may be sensed by comparing a value read at the first resistive memory element 106 to a value read at the second resistive memory element 108 without the need for a separate reference cell. For example, in order to sense a reversible write state of an MTJ, a reference voltage may be applied. When the memory cell 102 is configured as an OTP memory cell, the sensing is self-referenced in that complementary cell values are maintained at the first and second resistive memory elements 106, 108, such that the non-reversible state can be sensed by comparing a value read at the first resistive memory element 106 to a value read at the second resistive memory element 108.

Because the memory cell 102 may be configured as an OTP memory cell or a MTP memory cell, security architectures of electronic devices that incorporate the memory cell may be enhanced. For example, hardware features of a mobile electronic device such as joint test action group (JTAG) may be disabled after final test using one-time programmability. In addition, original equipment manufacturer hardware keys may be utilized with one-time programmability for provisioning, user information, digital rights management, etc. In addition, electronic devices that incorporate the memory cell 102 may be less susceptible to tampering due to de-processing and less susceptible to data manipulation than polysilicon based fuse systems.

Figure 2:
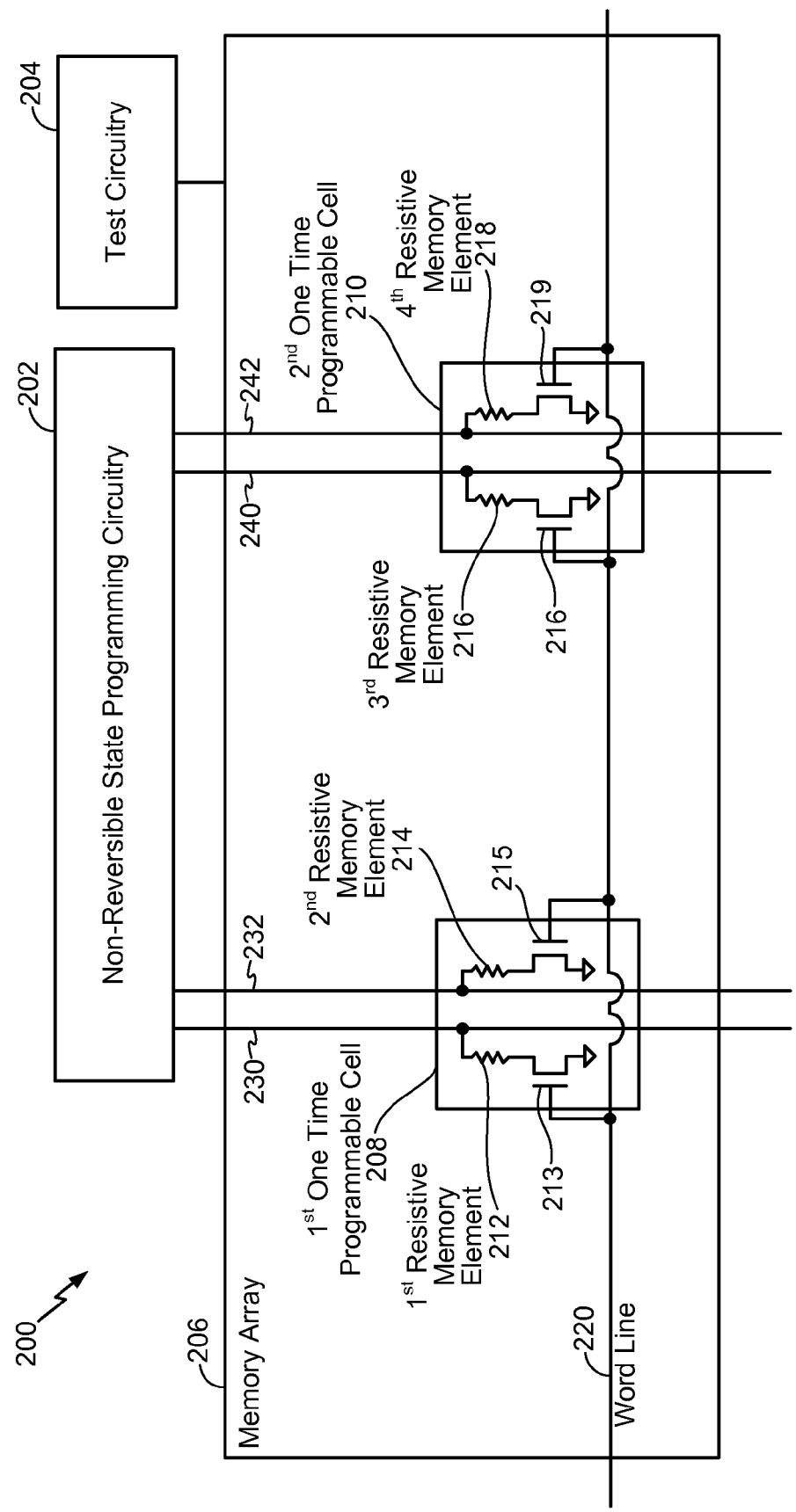
FIG. 2 is a diagram of a particular illustrative embodiment of a memory device including non-reversible state programming circuitry and a memory array with magnetic tunnel junction (MTJ)-based one-time programmable memory cells.

Referring to FIG. 2, a particular illustrative embodiment of a memory device including non-reversible state programming circuitry and a memory array with magnetic tunnel junction (MTJ)-based one-time programmable memory cells is depicted and generally designated 200. The memory device 200 includes non-reversible state programming circuitry 202, test circuitry 204, and a memory array 206 with one-time programmable (OTP) cells. The memory array 206 may include other memory cells, such as other MTJ memory cells, that are non-OTP memory cells. The OTP memory cells and the other MTJ memory cells may be manufactured using the same techniques. The memory array 206 includes a representative first one-time programmable cell 208 and a representative second one-time programmable cell 210. In a particular embodiment, the first one-time programmable cell 208 comprises a first dual-magnetic tunnel junction (MTJ) bitcell and the second one-time programmable cell 210 comprises a second dual-MTJ bitcell. The first one-time programmable cell 208 includes a first resistive memory element 212, a first access transistor 213, a second resistive memory element 214, and a second access transistor 215. The second one-time programmable cell 210 includes a third resistive memory element 216, a third access transistor 217, a fourth resistive memory element 218, and a fourth access transistor 219. In a particular embodiment, each of the resistive memory elements 212-218 comprises a magnetic tunnel junction element. A word line 220 is coupled to the first access transistor 213, to the second access transistor 215, to the third access transistor 217, and to the fourth access transistor 219.

The non-reversible state programming circuitry 202 is coupled to the first one-time programmable cell 208 via bitline 230 and bitline 232 and to the second one-time programmable cell 210 via bitline 240 and bitline 242. The non-reversible state programming circuitry 202 is configured to apply a program voltage via the bitline 230 to the first resistive memory element 212 of the first one-time programmable cell 208 without applying the program voltage to the second resistive memory element 214 of the first one-time programmable cell 208 to generate a first non-reversible state (e.g. logic "0") at the first one-time programmable cell 208. Alternatively, the non-reversible state programming circuitry 202 may apply the program voltage via the bitline 232 to the second resistive memory element 214 of the first one-time programmable cell 208 without applying the program voltage to the first resistive memory element 212 of the first one-time programmable cell 208 to generate a second non-reversible state (e.g. logic "1") at the first one-time programmable cell 208.

Similarly, the non-reversible state programming circuitry 202 is configured to apply the program voltage via the bitline 240 to the third resistive memory element 216 of the second one-time programmable cell 210 without applying the program voltage to the fourth resistive memory element 218 of the second one-time programmable cell 210 to generate the first non-reversible state at the second one-time programmable cell 210. Alternatively, the non-reversible state programming circuitry 202 may apply the program voltage via the bitline 242 to the fourth resistive memory element 218 of the second one-time programmable cell 210 without applying the program voltage to the third resistive memory element 216 of the second one-time programmable cell 210 to generate the second non-reversible state at the second one-time programmable cell 210.

In a particular embodiment, the non-reversible state may be sensed at the first one-time programmable cell 208 by comparing a value read at the first resistive memory element 212 to a value read at the second resistive memory element 214. In a particular embodiment, the non-reversible state of the first one-time programmable cell may be sensed without a separate reference cell.

For example, the sensing of the first one-time programmable cell 208 is self-referenced in that complementary cell values are maintained at the first and second resistive memory elements 212, 214 (e.g., the tunnel oxide of one of the resistive memory elements 212, 214 is blown while the tunnel oxide of the other one of the resistive memory elements 212, 214 is non-blown). The non-reversible state can be sensed by comparing a value read at the first resistive memory element 212 to a value read at the second resistive memory element 214 (e.g., by comparing a signal at the bitline 230 to a signal at the bitline 232). There is no need for a separate reference voltage to sense the reversible states of the resistive memory elements 212, 214.

The test circuitry 204 may be configured to test one or more cells of the memory array 206 prior to programming. For example, prior to applying the program voltage to the first resistive memory element 212 of the first one-time programmable cell 208, a write voltage may be applied to the first resistive memory element 212 to store a reversible value to the first one-time programmable cell 208. After applying the write voltage to the first resistive memory element 212, the first resistive memory element 212 may be read to test an operation of the first one-time programmable cell 208. Alternatively, prior to applying the program voltage to the second resistive memory element 214 of the first one-time programmable cell 208, a write voltage may be applied to the second resistive memory element 214 to store a reversible value to the first one-time programmable cell 208. After applying the write voltage to the second resistive memory element 214, the second resistive memory element 214 may be read to test an operation of the first one-time programmable cell 208.

In a particular embodiment, the third resistive memory element 216 and the fourth resistive memory element 218 may be substantially similar to the first resistive memory element 212 and the second resistive memory element 214. In a particular embodiment, the resistive memory elements 216 and 218 may be used as many-time programmable memory elements by providing a write voltage where the write voltage is lower than the program voltage (e.g., has a lower magnitude than the program voltage), causing the resistive memory element 216 or 218 to enter a reversible state.

By using MTJ elements in the bitcells of a memory array for one-time programmability, high speed programming may be achieved due to the smaller currents and shorter times needed to program the MTJ elements as compared to the larger currents and longer times needed to program polysilicon fuse elements.

Figure 3:
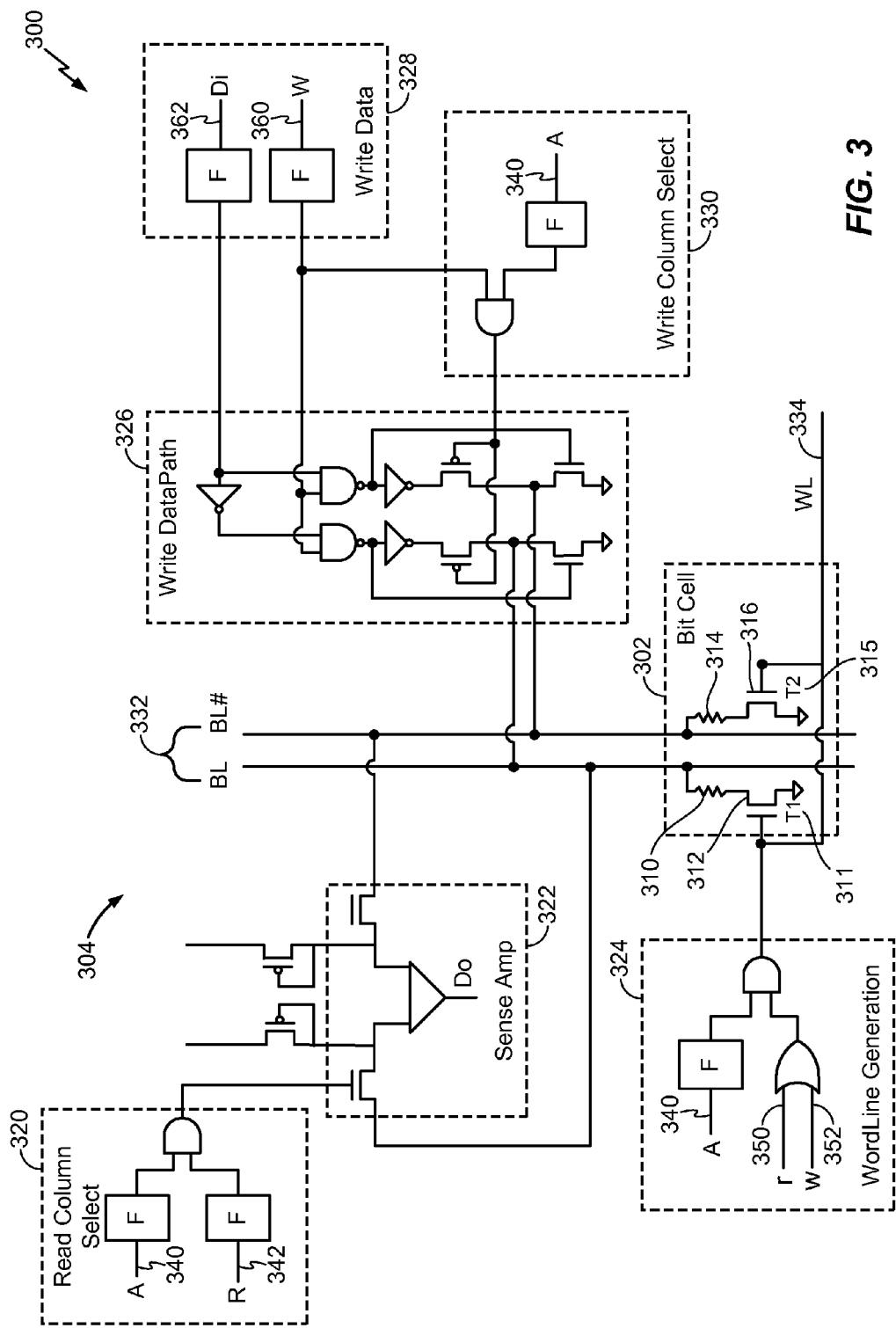
FIG. 3 is a diagram of a particular illustrative embodiment of a system including a bitcell having a first MTJ and a second MTJ and non-reversible state programming circuitry configured to provide a programming voltage to the bitcell.

Referring to FIG. 3, a particular illustrative embodiment of a system 300 includes a bitcell 302 having a first resistive memory element 310 and a second resistive memory element 314 and also including non-reversible state programming circuitry 304 configured to provide a programming voltage to the bitcell 302.

The programming circuitry 304 includes read column select circuitry 320, sense amplifier circuitry 322, word line generation circuitry 324, write data path circuitry 326, write data circuitry 328, write column select circuitry 330, and a pair of bitlines 332. The read column select circuitry 320 is configured to receive address data 340 and read data 342, and to provide an input to the sense amplifier circuitry 322. The sense amplifier circuitry 322 is configured to amplify a differential signal at the pair of bitlines 332 and to generate a data output signal (Do). The write data circuitry 328 is configured to latch received data input (Di) 362 and a write signal 360. The write column select circuitry 330 is configured to latch received address data 340. The write data path circuitry 326 is responsive to the write data circuitry 328 and the write column select circuitry 330 to apply signals to the pair of bitlines 332. The word line generation circuitry 324 is configured to selectively bias a word line 334 in response to the address data 340, a read signal 350, and the write signal 360.

The bitcell 302 includes the first resistive memory element 310 and the second resistive memory element 314. In a particular embodiment, the first resistive memory element 310 comprises a first magnetic tunnel junction (MTJ) and the second resistive memory element comprises a second MTJ. The bitcell 302 includes a first access transistor 312 coupled to the first MTJ 310 and a second access transistor 316 coupled to the second MTJ 314. In a particular embodiment, the first access transistor 312 may have a tunnel oxide with oxide thickness T1 311 and the second access transistor 316 may have a tunnel oxide with oxide thickness T2 315. The oxide thickness T1 311 may be substantially similar to the oxide thickness T2 315. The first access transistor 312 and the second access transistor 316 are responsive to the word line 334.

During operation, the non-reversible state programming circuitry 304 can apply a program voltage to the first MTJ 310 of the bitcell 302 without applying the program voltage to the second MTJ 314 of the bitcell 302 to generate a non-reversible state at the bitcell 302. Alternatively, the non-reversible state programming circuitry 304 can apply the program voltage to the second MTJ 314 of the bitcell 302 without applying the program voltage to the first MTJ 310 of the bitcell 302 to generate the non-reversible state at the bitcell 302.

For example, in a particular embodiment, the program voltage may cause the tunnel oxide of the first MTJ 310 to break down resulting in a permanent low resistance state of the first MTJ 310. In a particular embodiment, the tunnel oxide may be a magnesium oxide barrier layer and the program voltage may be greater than approximately 1.3 volts. After the tunnel oxide of the first MTJ 310 is broken down, a permanent short or low resistance state of the first MTJ 310 is created. For example, once blown, a resistance of the blown first MTJ 310 may be approximately 250 ohms. A native un-blown state of the second MTJ 314 may be a higher resistance, for example 2500 ohms. In a particular embodiment, a state of the first MTJ 310 (e.g., blown) may be maintained as complementary to a state of the second MTJ 314 (e.g., un-blown). The sensing of the bitcell 302 is self-referenced in that the non-reversible state can be sensed by comparing a value read at the first MTJ 310 to a value read at the second MTJ 314 (e.g., by comparing a signal at the pair of bitlines 332) without a separate reference voltage.

Figure 4:
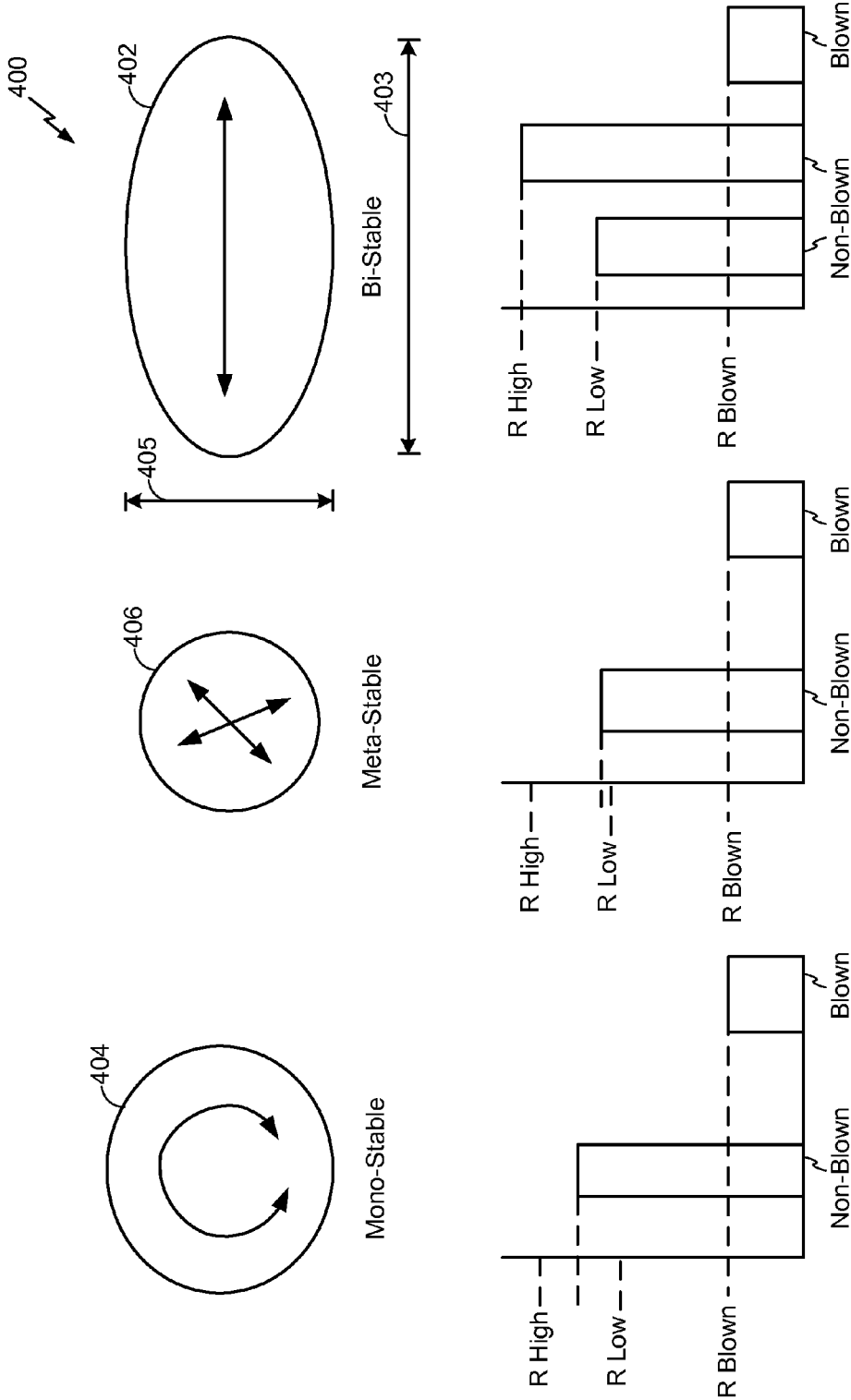
FIG. 4 is a diagrammatic representation of particular illustrative embodiments of MTJ shapes and attributes of each MTJ shape.

Referring to FIG. 4, particular illustrative embodiments of shapes for a one-time programmable magnetic tunnel junction (MTJ) bitcell are depicted and generally designated 400. A first MTJ has a substantially ellipsoidal shape 402, a second MTJ has a substantially circular shape 404, and a third MTJ has a substantially circular shape 406 smaller than the second MTJ. Arrows illustrate examples of magnetic moments of a free layer of each of the MTJs 402-406 as illustrative, non-limiting examples.

The MTJ with the ellipsoidal shape 402 has a bi-stable state when the MTJ 402 is non-blown. When in the bi-stable state, the MTJ 402 may have either a low resistance R Low (e.g., approximately 2500 ohms) or a high resistance R High (e.g., greater than 3000 ohms). In a blown state, the MTJ 402 may have a resistance at a blown resistance R Blown (e.g., approximately 250 ohms). In a particular embodiment, the ellipsoidal MTJ 402 has a first axis length 403 greater than a second axis length 405 to enable alignment of magnetic moments in the MTJ 402 in parallel and anti-parallel states, corresponding to a first reversible many-time programmable (MTP) state and a second reversible MTP state.

In a particular embodiment, the second MTJ with the circular shape 404 is in a mono-stable state when the second MTJ 404 is non-blown. For example, in the non-blown state, the second MTJ 404 may have a resistance halfway between the high resistance R High (e.g., greater than 3000 ohms) of the second MTJ 404 and the low resistance R Low (e.g., 2500 ohms) of the second MTJ 404. In the blown state, the second MTJ 404 may have a resistance at the blown resistance R Blown (e.g., approximately 250 ohms).

In a particular embodiment, the third MTJ with the circular shape 406 has a smaller diameter than that of the circular MTJ 404 such that the third MTJ 406 is in a meta-stable state when the third MTJ 406 is non-blown. For example, in the non-blown state, the third MTJ 406 may have a resistance at a point between the high resistance R High (e.g., greater than 3000 ohms) of the third MTJ 406 and the low resistance R Low (e.g., 2500 ohms) of the third MTJ 406. In the blown state, the third MTJ 406 may have a resistance at the blown resistance R Blown (e.g., approximately 250 ohms).

Figure 5:
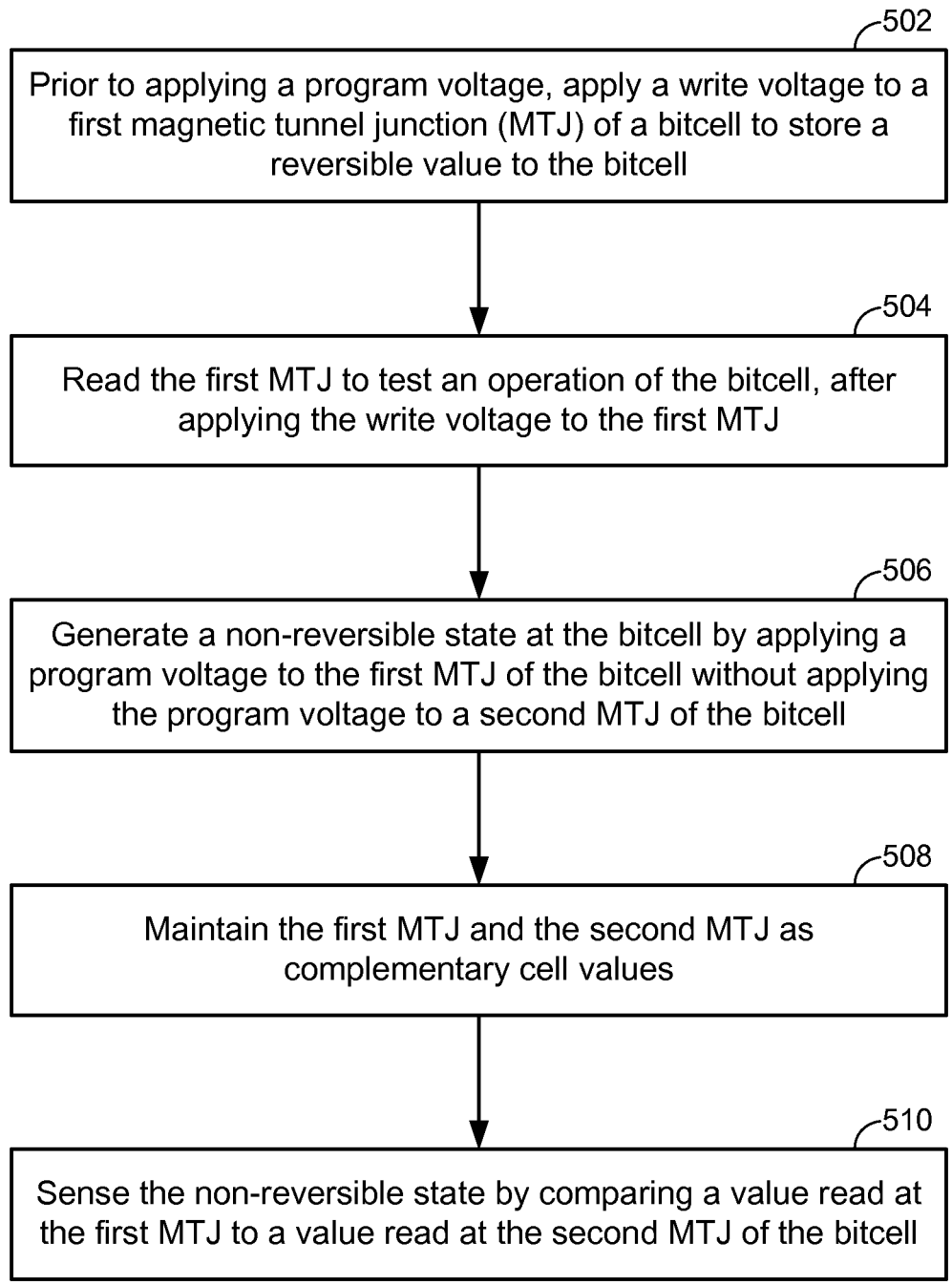
FIG. 5 is a flow diagram of a particular illustrative embodiment of a method of programming a non-reversible state to a bitcell having a first MTJ and a second MTJ.

Referring to FIG. 5, a flow diagram of an illustrative embodiment of a method of programming a non-reversible state to a bitcell having a first magnetic tunnel junction (MTJ) and a second MTJ is depicted and generally designated 500. As an illustrative example, the method 500 may be performed by the memory device of FIG. 1, the memory device of FIG. 2, the system of FIG. 3, or any combination thereof.

Prior to applying a program voltage to the bitcell, a write voltage may be applied to the first MTJ to store a reversible value to the bitcell, at 502, and the first MTJ may be read to test an operation of the bitcell after applying the write voltage to the first MTJ, at 504. In a particular embodiment, the bitcell may be the memory cell 102 of FIG. 1, the first one-time programmable cell 208 of FIG. 2, or the bitcell 302 of FIG. 3. In a particular embodiment, the first MTJ may be the first resistive memory element 106 of FIG. 1, the first resistive memory element 212 of FIG. 2, or the first resistive memory element 310 of FIG. 3, and the second MTJ may be the second resistive memory element 108 of FIG. 1, the second resistive memory element 214 of FIG. 2, or the second resistive memory element 314 of FIG. 3.

For example, the test circuitry 204 may be configured to test one or more cells of the memory array 206 prior to programming any of the cells of the memory array 206. For example, prior to applying the program voltage, a write voltage may be applied to the first resistive memory element 212 to store a reversible value to the first one-time programmable cell 208. After applying the write voltage to the first resistive memory element 212, the first resistive memory element 212 may be read to test an operation of the first one-time programmable cell 208. Alternatively, the write voltage may be applied to the second resistive memory element 214 to store a reversible value to the first one-time programmable cell 208. After applying the write voltage to the second resistive memory element 214, the second resistive memory element 214 may be read to test an operation of the first one-time programmable cell 208.

A non-reversible state may be generated at the bitcell by applying the program voltage to the first MTJ of the bitcell without applying the program voltage to the second MTJ of the bitcell, at 506. In a particular embodiment, the program voltage may be generated by the non-reversible state programming circuitry 104 of FIG. 1, the non-reversible state programming circuitry 202 of FIG. 2, or the non-reversible state programming circuitry 304 of FIG. 3.

The first MTJ and the second MTJ may be maintained as complementary cell values, at 508. For example, in a particular embodiment, the program voltage may cause a tunnel oxide, such as the tunnel oxide having thickness T1 311 of the first MTJ 310 to break down, resulting in a permanent low resistance state of the first MTJ 310. After the tunnel oxide of the first MTJ 310 is broken down, a permanent short or low resistance state of the first MTJ 310 is created. For example, once blown, a resistance of the blown first MTJ 310 may be approximately 250 ohms. A native un-blown state of the second MTJ 314 may be a higher resistance, for example 2500 ohms. As such, a cell value of the first MTJ 310 (e.g., blown) may be maintained as complementary to a cell value of the second MTJ 314 (e.g., un-blown).

The non-reversible state may be sensed by comparing a value read at the first MTJ to a value read at the second MTJ of the bitcell, at 510. For example, the sense amplifier circuitry 322 may be configured to generate the output Do in response to comparing a signal (e.g., a current or a voltage) read at the first MTJ 310 and a signal read at the second MTJ 314.

FIG. 6 is a block diagram of an embodiment of a wireless communication device 600 having non-reversible state programming circuitry and a bitcell including a first magnetic tunnel junction (MTJ) and a second MTJ 664. The wireless communication device 600 may be implemented as a portable wireless electronic device that includes a processor 610, such as a digital signal processor (DSP), coupled to a memory 632.

The non-reversible state programming circuitry and bitcell including first and second MTJs 664 may include one or more of the components, memories, or circuits of FIGS. 1-4, operates in accordance with FIG. 5, or any combination thereof. The non-reversible state programming circuitry and bitcell including first and second MTJs 664 may be in the memory 632 or may be a separate device. Although the non-reversible state programming circuitry and bitcell including first and second MTJs 664 is illustrated integrated with the memory 632, in other embodiments the non-reversible state programming circuitry and bitcell including first and second MTJs 664 may be external to the memory 632, such as embedded in the processor 610.

In a particular embodiment, a display controller 626 is coupled to the processor 610 and to a display device 628. A coder/decoder (CODEC) 634 can also be coupled to the processor 610. A speaker 636 and a microphone 638 can be coupled to the CODEC 634. A wireless controller 640 can be coupled to the processor 610 and to a wireless antenna 642.

The memory 632 may include a computer readable medium that stores instructions (e.g., software 635) that are executable by a processor, such as the processor 610. For example, the software 635 may include instructions that are executable by a computer to apply a program voltage to a first MTJ (e.g., the first resistive memory element 106 of FIG. 1) of a bitcell (e.g., the memory cell 102 of FIG. 1) without applying the program voltage to a second MTJ (e.g., the second resistive memory element 108 of FIG. 1) of the bitcell to generate a non-reversible state at the bitcell.

In a particular embodiment, the signal processor 610, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display device 628, the input device 630, the speaker 636, the microphone 638, the wireless antenna 642, and the power supply 644 are external to the system-on-chip device 622. However, each of the display device 628, the input device 630, the speaker 636, the microphone 638, the wireless antenna 642, and the power supply 644 can be coupled to a component of the system-on-chip device 622, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

FIG. 7 depicts a particular illustrative embodiment of an electronic device manufacturing process 700. Physical device information 702 is received at the manufacturing process 700, such as at a research computer 706. The physical device information 702 may include design information representing at least one physical property of a semiconductor device, such as the memory device 100 of FIG. 1, the memory device 200 of FIG. 2, the system 300 of FIG. 3, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including a device that includes the memory device 100 of FIG. 1, a device that includes the memory device 200 of FIG. 2, a device that includes the system 300 of FIG. 3, or any combination thereof, that is provided to use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including a device that includes the memory device 100 of FIG. 1, a device that includes the memory device 200 of FIG. 2, a device that includes the system 300 of FIG. 3, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as a device that includes the memory device 100 of FIG. 1, a device that includes the memory device 200 of FIG. 2, a device that includes the system 300 of FIG. 3, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the memory device 100 of FIG. 1, the memory device 200 of FIG. 2, the system 300 of FIG. 3, or any combination thereof, in addition to other circuits or information. To illustrate, the data file may include information corresponding to a system-on-chip (SOC) that includes the memory device 100 of FIG. 1 and that also includes additional electronic circuits and components within the SOC.

The GDSII file 726 may be received at a fabrication process 728 to manufacture the memory device 100 of FIG. 1, the memory device 200 of FIG. 2, the system 300 of FIG. 3, or any combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes a circuit including a device that includes the memory device 100 of FIG. 1, a device that includes the memory device 200 of FIG. 2, a device that includes the system 300 of FIG. 3, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the memory device 100 of FIG. 1, the memory device 200 of FIG. 2, the system 300 of FIG. 3, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the memory device 100 of FIG. 1, the memory device 200 of FIG. 2, the system 300 of FIG. 3, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer, into which the non-reversible state programming circuitry and bitcell including first and second MTJs 664 of FIG. 6 is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the memory device 100 of FIG. 1, a device that includes the memory device 200 of FIG. 2, a device that includes the system 300 of FIG. 3, or any combination thereof, may be fabricated, processed, and incorporated into an electronic device, as described in the illustrative process 700. One or more aspects of the embodiments disclosed with respect to FIGS. 1-4 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A memory device comprising:
   a magnetic tunnel junction (MTJ) bitcell comprising:
      a first MTJ; and
      a second MTJ; and
   programming circuitry configured to apply a program signal to a selected one of the first MTJ and the second MTJ to generate a non-reversible state at the MTJ bitcell, wherein the non-reversible state corresponds to a value of the MTJ bitcell that is determined by comparing a first value read at the first MTJ and a second value read at the second MTJ.

2. The memory device of claim 1, further comprising sensing circuitry configured to sense the non-reversible state by comparing the first value to the second value.

3. The memory device of claim 1, further comprising a first access transistor coupled to the first MTJ and a second access transistor coupled to the second MTJ.

4. The memory device of claim 3, wherein the first access transistor has a first oxide thickness that is substantially similar to a second oxide thickness of the second access transistor before application of the program signal to the first access transistor.

5. The memory device of claim 3, wherein a first cell value of the first MTJ is complementary to a second cell value of the second MTJ after application of the program signal to the first access transistor.

6. The memory device of claim 1, wherein the MTJ bitcell is integrated in at least one semiconductor die.

7. The memory device of claim 1, further comprising a device comprising a set top box, a music player, a video player, an entertainment unit, a navigation device, a communications device, a personal digital assistant (PDA), a fixed location data unit, a computer, or a combination thereof, into which the MTJ bitcell is integrated.

8. The memory device of claim 1, wherein, when the programming signal is applied to the first MTJ, the program signal causes a tunnel oxide of the first MTJ to break down resulting in a low resistance state of the first MTJ.

9. The memory device of claim 1, wherein the first MTJ has a first axis length greater than a second axis length of the first MTJ to enable switching the first MTJ from a first non-programmed state to a second non-programmed state.

10. The memory device of claim 9, wherein a cross-sectional area of the first MTJ is ellipsoidal.

11. The memory device of claim 1, further comprising a third MTJ of the MTJ bitcell, wherein the third MTJ is configured to be used as a multi-time programmable memory element when a write voltage is provided to the third MTJ, wherein a first voltage value of the write voltage is lower than a second voltage value of the program signal, and wherein the write voltage causes the third MTJ to enter a reversible state.

12. The memory device of claim 1, further comprising a differential amplifier, wherein the first value is associated with a first input of the differential amplifier, and wherein the second value is associated with a second input of the differential amplifier.

13. The memory device of claim 1, wherein the first value is associated with a first voltage of a first bit line coupled to the first MTJ and the second value is associated with a second voltage of a second bit line coupled to the second MTJ.

14. An apparatus comprising:
 means for storing a data value, the means for storing comprising a first magnetic tunnel junction (MTJ) and a second MTJ; and
 means for generating a non-reversible state at the means for storing by applying a program voltage to the first MTJ without applying the program voltage to the second MTJ, wherein the non-reversible state corresponds to a value of the means for storing that is determined by comparing a first value read at the first MTJ and a second value read at the second MTJ.

15. The apparatus of claim 14, further comprising means for comparing the first value to the second value to sense the non-reversible state.

16. The apparatus of claim 14, wherein the means for storing is integrated in at least one semiconductor die.

17. The apparatus of claim 14, further comprising a device comprising a set top box, a music player, a video player, an entertainment unit, a navigation device, a communications device, a personal digital assistant (PDA), a fixed location data unit, a computer, or a combination thereof, into which the means for storing is integrated.

18. A computer readable tangible medium storing instructions executable by a processor to:
 generate a non-reversible state at a bitcell by applying a program voltage to a first magnetic tunnel junction (MTJ) of the bitcell without applying the program voltage to a second MTJ of the bitcell, wherein the non-reversible state corresponds to a value of the MTJ bitcell that is determined by comparing a first value read at the first MTJ and a second value read at the second MTJ.

19. The computer readable tangible medium of claim 18, wherein the processor is integrated in a device comprising a set top box, a music player, a video player, an entertainment unit, a navigation device, a communications device, a personal digital assistant (PDA), a fixed location data unit, a computer, or a combination thereof.

20. The computer readable tangible medium of claim 18, wherein the instructions are executable by the processor to sense the non-reversible state by comparing the first value to the second value.

* * * * *